(12) United States Patent
Pascal (10) Patent No.: US 6,434,775 B1
(45) Date of Patent: Aug. 20, 2002

(54) NOZZLE FOR RINSING THE BACKSIDE OF A SEMICONDUCTOR WAFER

(75) Inventor: Roy Winston Pascal, Union City, CA (US)

(73) Assignee: Lam Research Corporaton, Fremont, CA (US)

( * ) Notice: Subject to any disclaimer, the term of this patent is extended or adjusted under 35 U.S.C. 154(b) by 0 days.

(21) Appl. No.: 09/470,675

(22) Filed: Dec. 23, 1999

(51) Int. Cl.⁷ .............................. B08B 3/02; B05B 1/04
(52) U.S. Cl. .............................. 15/77; 15/21.1; 134/61; 134/902; 239/568; 239/597
(58) Field of Search .................... 134/61, 902; 239/567, 239/568, 597; 15/21.1, 77, 88.2, 88.3, 88.1

(56) References Cited

U.S. PATENT DOCUMENTS

| | | | | |
|---|---|---|---|---|
| 640,378 A | * | 1/1900 | Hammel ................. | 239/597 X |
| 736,134 A | * | 8/1903 | Murphy ................. | 239/597 |
| 1,335,267 A | * | 3/1920 | Ambrose et al. ....... | 239/268 X |
| 1,511,118 A | * | 10/1924 | Fiduccia, Sr. .......... | 239/597 X |
| 1,718,556 A | * | 6/1929 | Harrison ................. | 239/597 X |
| 2,544,558 A | * | 3/1951 | MacGregor ............. | 239/568 X |
| 2,647,014 A | * | 7/1953 | Edwards ................ | 239/568 X |
| 2,760,817 A | * | 8/1956 | Novak .................... | 239/568 X |
| 3,675,855 A | * | 7/1972 | Harwood et al. ....... | 239/597 |
| 4,193,552 A | * | 3/1980 | Ishikawa ................ | 239/567 X |
| 4,635,666 A | * | 1/1987 | Daley et al. ........... | 134/902 X |
| 5,290,600 A | * | 3/1994 | Ord et al. .............. | 239/597 X |
| 5,794,299 A | * | 8/1998 | Gockel et al. ......... | 15/77 |
| 5,927,305 A | * | 7/1999 | Shiba .................... | 134/902 X |
| 6,004,399 A | * | 12/1999 | Wong et al. ........... | 134/902 X |

FOREIGN PATENT DOCUMENTS

FR 1140623 * 7/1957 ................. 239/568

* cited by examiner

*Primary Examiner*—Mark Spisich
(74) *Attorney, Agent, or Firm*—Martine & Penilla, LLP (57) ABSTRACT

A nozzle includes a body having an entrance location and an exit location. The body has a curved exit surface defined at the exit location. An internal chamber is defined in the body below the curved exit surface and a channel extends between the entrance location and the internal chamber. A slit defines an opening in the curved exit surface. The slit extends from the curved exit surface into the internal chamber. The curved exit surface and the slit are configured to define a fanned spray when liquid flows out of the slit. A method for rinsing the backside of a semiconductor wafer includes the operations of forming a wafer transport truck into a nozzle, and spraying a liquid from the nozzle onto the backside of the wafer.

12 Claims, 8 Drawing Sheets

NOZZLE FOR RINSING THE BACKSIDE OF A SEMICONDUCTOR WAFER

BACKGROUND OF THE INVENTION

The present invention relates generally to semiconductor fabrication and, more particularly, to a nozzle and a method for rinsing the backside of a semiconductor wafer.

As the semiconductor industry moves to larger, e.g., 300 mm, wafers and to smaller, e.g., 0.18 μm and smaller, feature sizes, it is becoming increasingly more important to rinse effectively and to control wafer contamination on the bottom side, i.e., the backside, of wafers during wafer preparation operations. In one conventional brush station, the exit rinse manifolds, which are located at the exits from the first and second brush boxes of the brush station, include lower nozzles positioned to spray deionized (DI) water onto the backside of a wafer. To provide the DI water sprayed from these lower nozzles with a path to the center portion of the backside of a wafer, an aperture is provided in the wafer transport truck that carries the wafer through the exit rinse manifold. This aperture, however, does not permit an effective amount of the DI water sprayed from the lower nozzles to reach the center portion of the backside of a wafer. Thus, the lower nozzles in the exit rinse manifold do not thoroughly rinse the backside of a wafer.

In view of the foregoing, there is a need for a method and device for rinsing a backside of a wafer that ensures that the backside of a wafer is thoroughly rinsed.

SUMMARY OF THE INVENTION

Broadly speaking, the present invention fills this need by providing a nozzle that may be used to rinse the backside of a semiconductor wafer. The present invention also provides a method for rinsing the backside of a semiconductor wafer.

In accordance with one aspect of the present invention, a nozzle is provided. The nozzle includes a body having an entrance location and an exit location. The body has a curved exit surface defined at the exit location. An internal chamber is defined in the body below the curved exit surface and a channel extends between the entrance location and the internal chamber. A slit defines an opening in the curved exit surface. The slit extends from the curved exit surface into the internal chamber. The curved exit surface and the slit are configured to define a fanned spray when liquid flows out of the slit.

In one embodiment, the opening in the curved exit surface defines an elliptical path. In one embodiment, the slit is oriented at an angle of about 15 degrees to about 50 degrees relative to a horizontal plane. In a preferred embodiment, the slit is oriented at an angle of about 30 degrees to about 35 degrees relative to a horizontal plane. In one embodiment, the fanned spray is directed toward a center portion of a backside of a semiconductor wafer.

In one embodiment, the body is a wafer transport truck. In one embodiment, the fanned spray has a width greater than a width of the wafer transport truck. In one embodiment, the wafer transport truck is disposed in a brush station. In one embodiment, the wafer transport truck is disposed proximate to an exit from a first brush box. In another embodiment, the wafer transport truck is disposed proximate to an exit from a second brush box.

In accordance with another aspect of the present invention, a method for rinsing the backside of a semiconductor wafer is provided. In this method a wafer transport truck is first formed into a nozzle. A liquid is then sprayed from the nozzle onto a backside of a semiconductor wafer.

In one embodiment, the nozzle is configured to direct a fanned liquid spray toward a center portion of the backside of the semiconductor wafer. In one embodiment, the nozzle includes a curved surface in which a slit is defined. In one embodiment, the nozzle is disposed in a brush station. In one embodiment, the nozzle is disposed just before an exit from a first brush box. In another embodiment, the nozzle is disposed just before an exit from a second brush box.

The nozzle of the present invention enables the backside of a semiconductor wafer to be thoroughly rinsed. This is beneficial because it not only helps minimize particle contamination on the backside of the wafer, but also neutralizes the pH of the surface of the backside of the wafer.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Several exemplary embodiments of the invention will now be described in detail with reference to the accompanying drawings.

Figure 1:
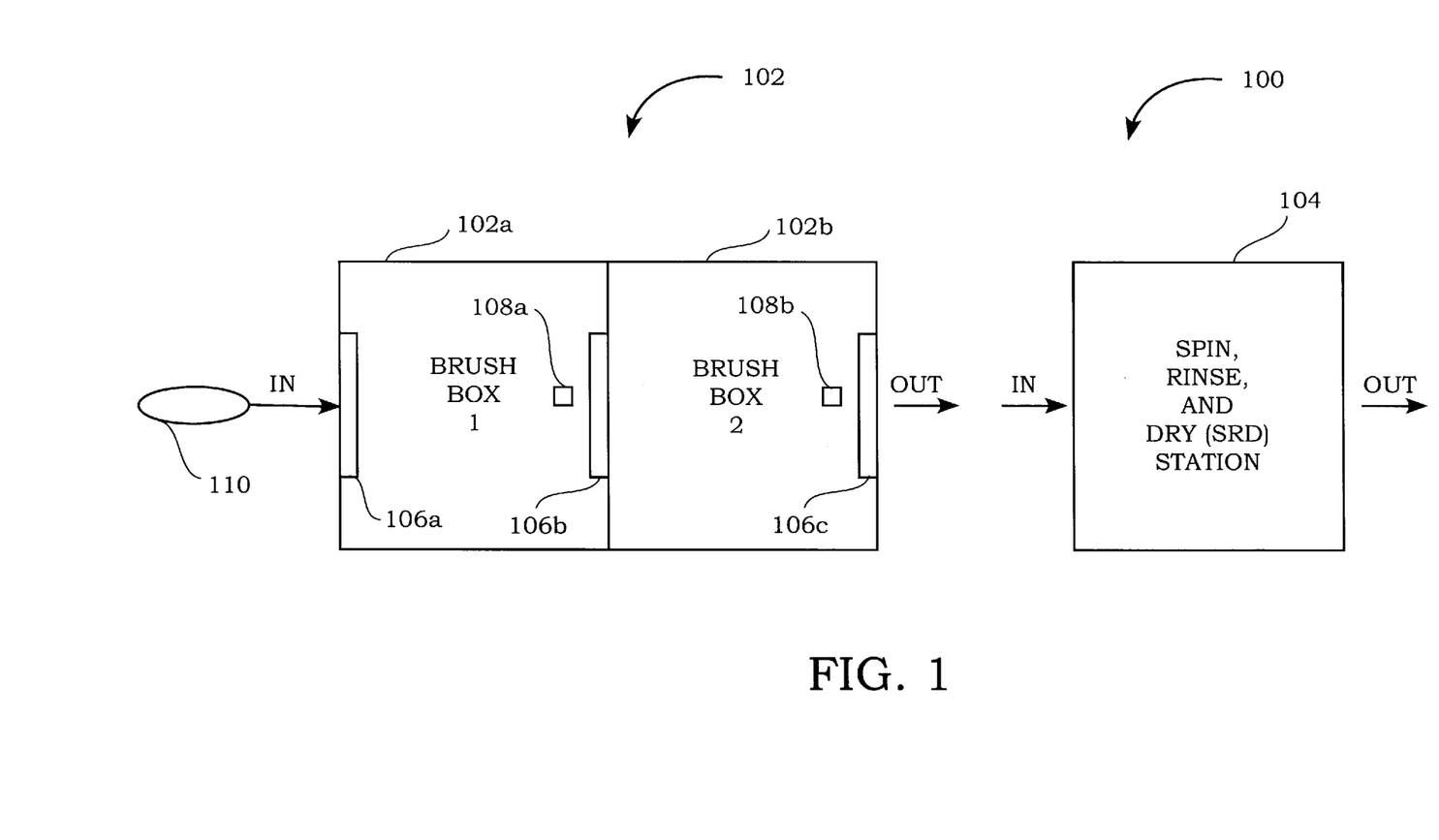
FIG. 1 is a simplified schematic diagram of wafer cleaning system that shows two exemplary locations at which the nozzle of the present invention may be disposed to rinse the backside of a semiconductor wafer.

FIG. 1 is a simplified schematic diagram of wafer cleaning system 100 that shows two exemplary locations at which the nozzle of the present invention may be disposed to rinse the backside of a semiconductor wafer. As shown therein, wafer cleaning system 100 includes brush station 102 and spin, rinse, and dry (SRD) module 104. Those skilled in the art are familiar with the details of brush station 102 and SRD module 104. Brush station 102 includes first brush box 102a and second brush box 102b. Inlet rinse manifold 106a is disposed at the entrance to first brush box 102a and exit rinse manifold 106b is disposed at the exit from first brush box 102a. Exit rinse manifold 106c is disposed at the exit from second brush box 102b. Each of rinse manifolds 106a, 106b, and 106c may include one or more nozzles for spraying a liquid, e.g., deionized (DI) water, onto the top side and the bottom side, i.e., the backside, of a semiconductor wafer.

Nozzle location 108a is located just before the exit from first brush box 102a and nozzle location 108b is located just before the exit from second brush box 102b. It should be noted that nozzle locations 108a and 108b refer to the location of the opening, e.g., slit, in the nozzle through which liquid is sprayed. In one embodiment, nozzle locations 108a and 108b are located about 0.5 inch to about 2.5 inches before the exit from first brush box 102a and second brush box 102b, respectively. In a preferred embodiment, nozzle locations 108a and 108b are located about 1.5 inches before the exit from first brush box 102a and second brush box 102b, respectively.

In operation, a wafer transport conveyor carries semiconductor wafer 110 through brush station 102. As wafer 110 enters first brush box 102a, wafer 110 is rinsed by inlet rinse manifold 106a. After this rinsing operation, brushes scrub wafer 110 in the presence of a desired chemistry. Next, as wafer 110 is carried toward the exit from first brush box 102a, the backside of wafer 110 is sprayed with liquid, e.g., DI water, from a nozzle, the details of which will be described later, disposed at nozzle location 108a. As wafer 110 exits from first brush box 102a, wafer 110 is further rinsed by exit rinse manifold 106b. Once inside second brush box 102b, brushes scrub wafer 110 in the presence of a desired chemistry. After this scrubbing operation, the backside of wafer 110 is sprayed with liquid, e.g., DI water, from a nozzle, the details of which will be described later, disposed at nozzle location 108b. As wafer 110 exits from second brush box 102b, wafer 110 is further rinsed by exit rinse manifold 106c. After exiting from second brush box 102b, wafer 110 is transported to SRD module 104 in which well-known spin rinsing and drying operations are performed on wafer 110.

It will be apparent to those skilled in the art that, if desired, a nozzle may be disposed at only one of nozzle locations 108a and 108b. For example, depending upon the particular chemistries being used to scrub the wafer, it may not be necessary to place a nozzle at both of nozzle locations 108a and 108b. By way of example, if different chemistries are being used in first brush box 102a and second brush box 102b, then nozzles may be desirable at both nozzle locations 108a and 108b. On the other hand, if different chemistries are not being used in first brush box 102a and second brush box 102b, then it may be desirable to have a nozzle only at nozzle location 108b.

Figure 2A:
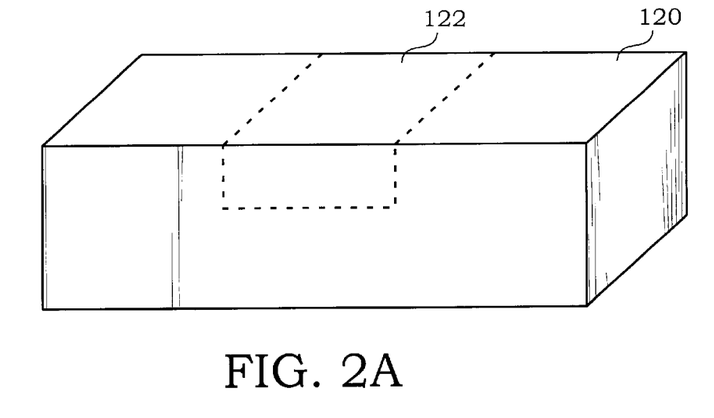
FIG. 2A shows a body that may be used to make a nozzle in accordance with one embodiment of the invention.
Figure 2B:
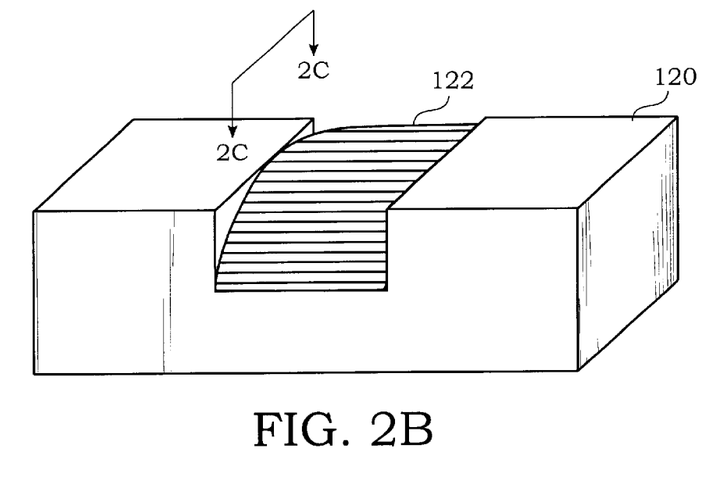
FIG. 2B shows the body shown in FIG. 2A after section 122 has been machined to have a curved surface.
Figure 2C:
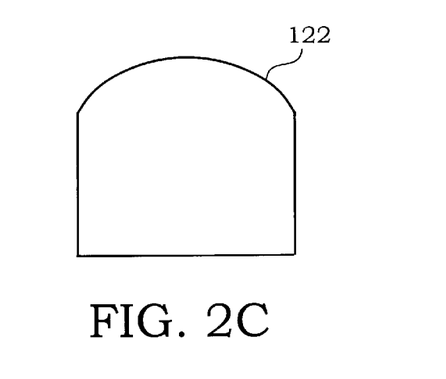
FIG. 2C is a cross-sectional view of section 122 taken along plane 2C shown in FIG. 2B.

FIGS. 2A to 2G illustrate an exemplary method for making a nozzle in accordance with one embodiment of the invention. FIG. 2A shows body 120, which serves as the starting point for the method. As shown therein, body 120 is a block having a generally rectangular shape. The first operation in the method of making the nozzle is to define a section that will serve as the exit location for body 120 and in which a curved exit surface will be formed. As shown in FIG. 2A, section 122, which is indicated by dashed lines, has been defined as the section in which the curved exit surface will be formed. FIG. 2B shows body 120 after section 122 has been machined to have a curved surface. The contour of this curved surface is shown in FIG. 2C, which is a cross-sectional view of section 122 taken along plane 2C shown in FIG. 2B.

Figure 2D:
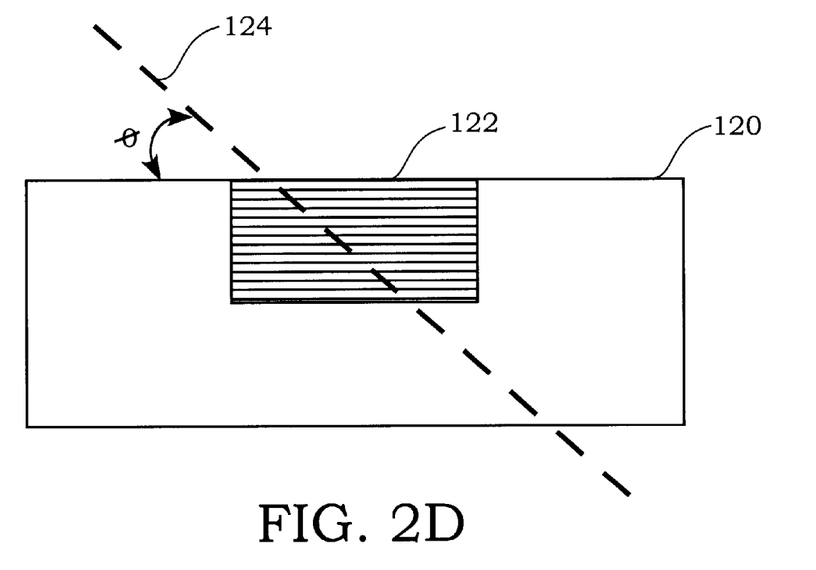
FIG. 2D shows the cut plane used to cut the body shown in FIG. 2B into two pieces.

Once the curved exit surface has been formed in section 122, the next operation in the method of making the nozzle is to cut body 120 into two pieces. FIG. 2D shows the cut plane used to cut body 120 into two pieces. As shown therein, cut plane 124 passes through curved section 122 and defines an angle, θ, relative to a horizontal plane. In one embodiment, the angle, θ, is in a range from about 15 degrees to about 50 degrees. In a preferred embodiment, the angle, θ, is in a range from about 30 degrees to about 35 degrees. If the angle, θ, is smaller than about 15 degrees, then the rinsing efficiency may decline due to a boundary layer on the wafer. If the angle, θ, is larger than about 50 degrees, then the liquid spray from the nozzle may lift the wafer from the wafer transport conveyor.

Figure 2E:
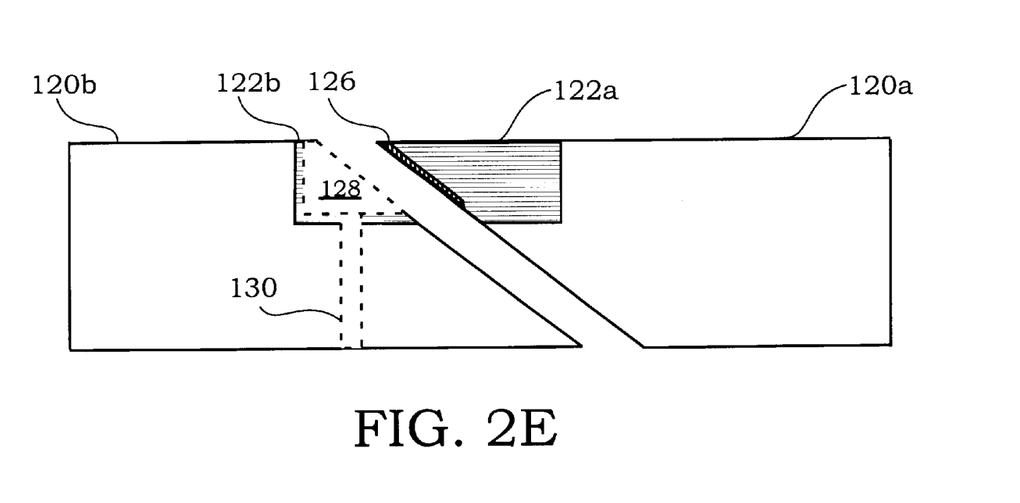
FIG. 2E shows the body shown in FIG. 2B after the body has been cut into two pieces along the cut plane shown in FIG. 2D and additional machining operations have been performed.
Figure 3:
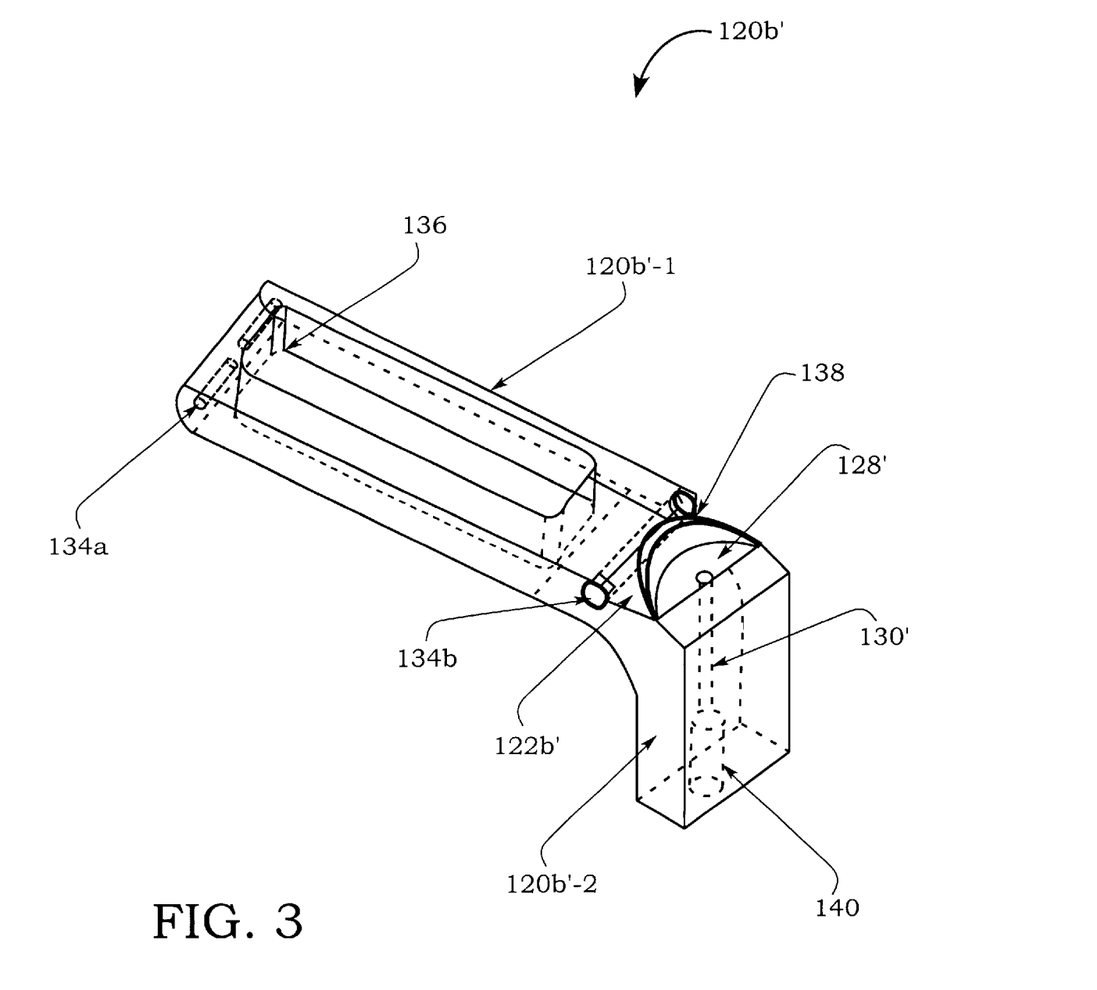
FIG. 3 is a perspective view of one piece of a two-piece nozzle formed in accordance with one embodiment of the invention.

After body 120 is cut into two pieces along cut plane 124, additional machining operations are performed on the two pieces. FIG. 2E shows body portion 120a and body portion 120b after these machining operations have been performed. Considering first body portion 120a, a small step of material is machined from area 126 in curved section 122a so that a narrow slit will be formed when body portions 120a and 120b are joined together. The amount of material machined from area 126 may be varied to obtain a slit having a desired width. In one embodiment, the step of material machined from area 126 is in a range from about 2 thousandths of an inch to about 4 thousandths of an inch. Turning to body portion 120b, a pocket of material is machined from area 122b to define internal chamber 128 below the curved surface of section 122. In one embodiment, internal chamber 128 has a generally elliptical shape, as shown in FIG. 3. Once internal chamber 128 is formed, body portion 120b is machined to define channel 130, which will be used to deliver liquid to internal chamber 128.

Figure 2F:
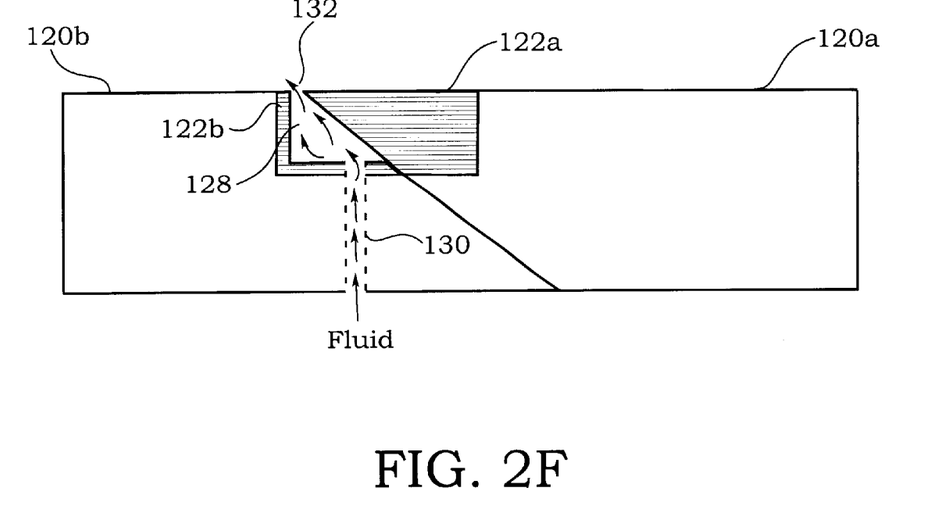
FIG. 2F shows the body portions shown in FIG. 2E after they have been joined together to form a nozzle in accordance with one embodiment of the invention.
Figure 2G:
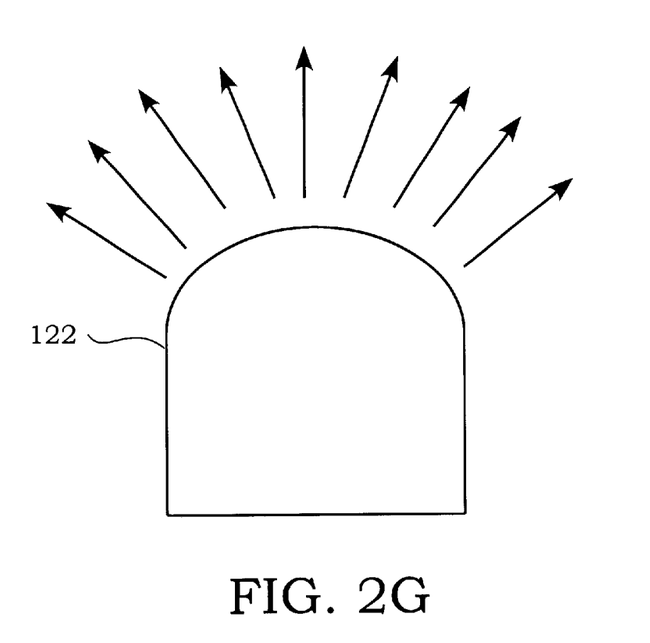
FIG. 2G illustrates the fanned pattern of liquid that flows out of the slit defined in the curved surface of the body in accordance with one embodiment of the invention.
Figure 4:
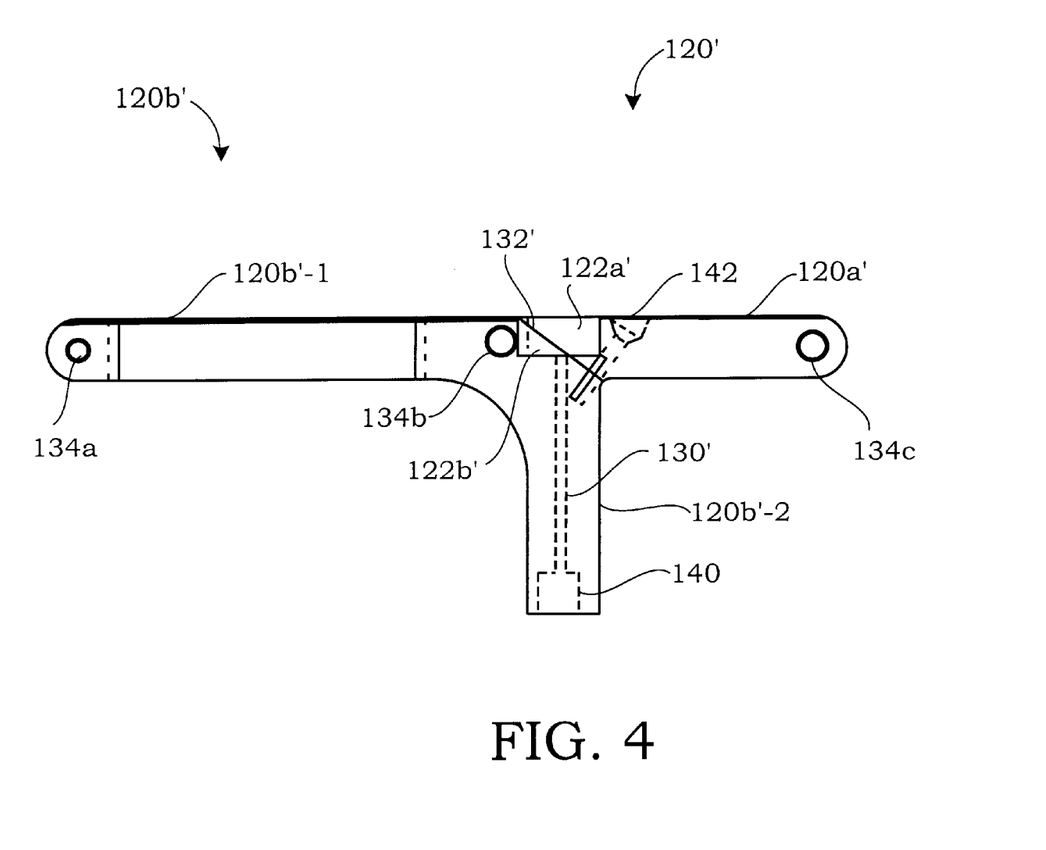
FIG. 4 is a simplified side view of a two-piece nozzle formed in accordance with one embodiment of the invention.

FIG. 2F shows body portions 120a and 120b shown in FIG. 2E after they have been joined together to form the nozzle. Body portions 120a and 120b may be joined together by any suitable joining technique. In one embodiment, body portions 120a and 120b are joined together by a mechanical fastener, as shown in FIG. 4. In operation, liquid from an appropriate liquid source, e.g., a DI water source, enters the inlet of channel 130, which serves as the entrance location for body 120. The liquid flows through channel 130 and into internal chamber 128. Once internal chamber 128 becomes filled, liquid will begin flowing out of slit 132 in a fanned pattern, as shown in FIG. 2G. The liquid flows out of slit 132 in a fanned pattern because internal chamber 128 equalizes the liquid pressure along the slit and because both surfaces that define the slit end at substantially the same point, i.e., there is no substantial overhang.

FIG. 3 is a perspective view of one piece of a two-piece nozzle formed in accordance with one embodiment of the invention. As shown in FIG. 3, body portion 120b' includes horizontal extension 120b'-1 and vertical extension 120b'-2 so as to form a portion of a wafer transport truck. Horizontal extension 120b'-1 has cylindrical apertures 134a and 134b formed therein for receiving axles. As is well known to those skilled in the art, these axles support the pulleys upon which the O-rings that transport a semiconductor wafer are mounted. Horizontal extension 120b'-1 also has rectangular aperture 136 formed therein. As discussed above, rectangular aperture 136 enables some, but not an effective amount, of the liquid sprayed from the bottom nozzles of a rinse manifold to pass through horizontal extension 120b'-1 and contact the backside of a semiconductor wafer.

Vertical extension 120b'-2 includes curved section 122b' in which internal chamber 128' has been formed. In one embodiment, the depth of internal chamber 128' is about 0.25 inch. As shown in FIG. 3, the surface forming the back wall of internal chamber 128' defines a generally elliptical shape. In addition, surface 138, which defines one side of the slit formed when body portion 120b' is joined together with body portion 120a' (see FIG. 4), follows an elliptical path. Channel 130' extends from chamber 128' to recess 140, which is configured to receive a liquid supply tube.

FIG. 4 is a simplified side view of a two-piece nozzle formed in accordance with one embodiment of the invention. As shown therein, body portions 120a' and 120b' are joined together by a pair of fasteners 142 (only one of which is shown in FIG. 4) to form a wafer transport truck. Body portion 120b' shown in FIG. 4 corresponds to body portion 120b' shown in FIG. 3. Body portion 120a' has cylindrical aperture 134c formed therein for receiving an axle, as described above with reference to FIG. 3. Slit 132' defines an opening in the curved exit surface formed by curved sections 122a' and 122b' of body portions 120a' and 120b', respectively. By way of example, the nozzle shown in FIG. 4 may be integrated into a wafer transport conveyor system at one or both of the nozzle locations shown in FIG. 1. In one embodiment, the nozzle is oriented so that the liquid spray from slit 132' is directed toward an oncoming semiconductor wafer. The fanned spray emanating from slit 132' contacts a center region of the backside of the wafer. When body 120' is a standard wafer transport truck, the fanned spray spreads out beyond the width of the wafer transport truck and contacts a center region having a diameter of about 3.5 inches, even though the wafer is typically situated only about 0.125 inch above the wafer transport truck.

Body 120' and fasteners 142 may be formed from any suitable inert, nonmetallic material such as, for example, fluorinated polymers. Exemplary fluorinated polymers include polytetrafluoroethylene (PTFE), which is commercially available from E.I. duPont de Nemours and Company under the trademark TEFLON, and polyvinylidene fluoride, which is commercially available from Elf Atochem North America, Inc. under the trademark KYNAR. In addition to fluorinated polymers, body 120' and fasteners 142 also may be formed from polymers such as polyethylene terephthalate (PET) and polyetheretherketone (PEEK).

If desired, the two-piece nozzle shown in FIG. 4 may be formed as one piece. By way of example, the nozzle may be formed as one piece using a rapid prototyping technique, e.g., stereolithography. Alternatively, the nozzle may be formed as one piece using an appropriate molding technique.

Figure 5:
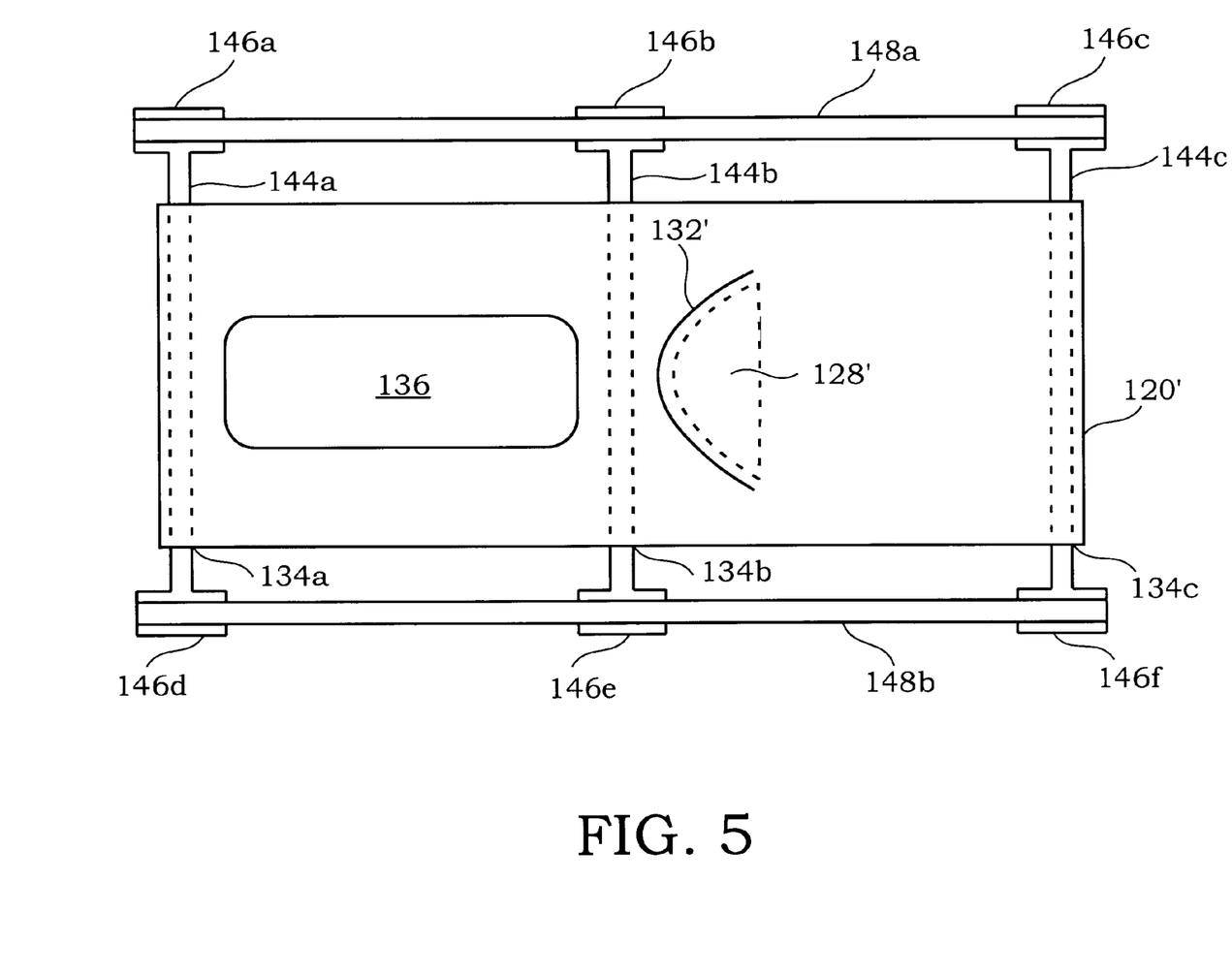
FIG. 5 is a simplified top view of the nozzle shown in FIG. 4 with axles, pulleys, and O-rings mounted thereon for transporting a semiconductor wafer.

FIG. 5 is a simplified top view of the nozzle shown in FIG. 4 with axles, pulleys, and O-rings mounted thereon for transporting a semiconductor wafer. As shown therein, body 120' has slit 132' and aperture 136 defined therein. Internal chamber 128' is defined below the curved surface in which slit 132' is defined, as indicated by the dashed lines in FIG. 4. Axles 144a, 144b, and 144c are disposed in apertures 134a, 134b, and 134c, respectively. Pulleys 146a and 146d are mounted on the opposing ends of axle 144a. Pulleys 146b and 146e are mounted on the opposing ends of axle 144b. Pulleys 146c and 146f are mounted on the opposing ends of axle 144c. O-ring 148a is disposed on pulleys 146a, 146b, and 146c and O-ring 148b is disposed on pulleys 146d, 146e, and 146f. In operation, a semiconductor wafer sits on O-rings 148a and 148b and is transported when O-rings 148a and 148b are rotated by a drive mechanism in one or more of pulleys 146a–f.

Figure 6:
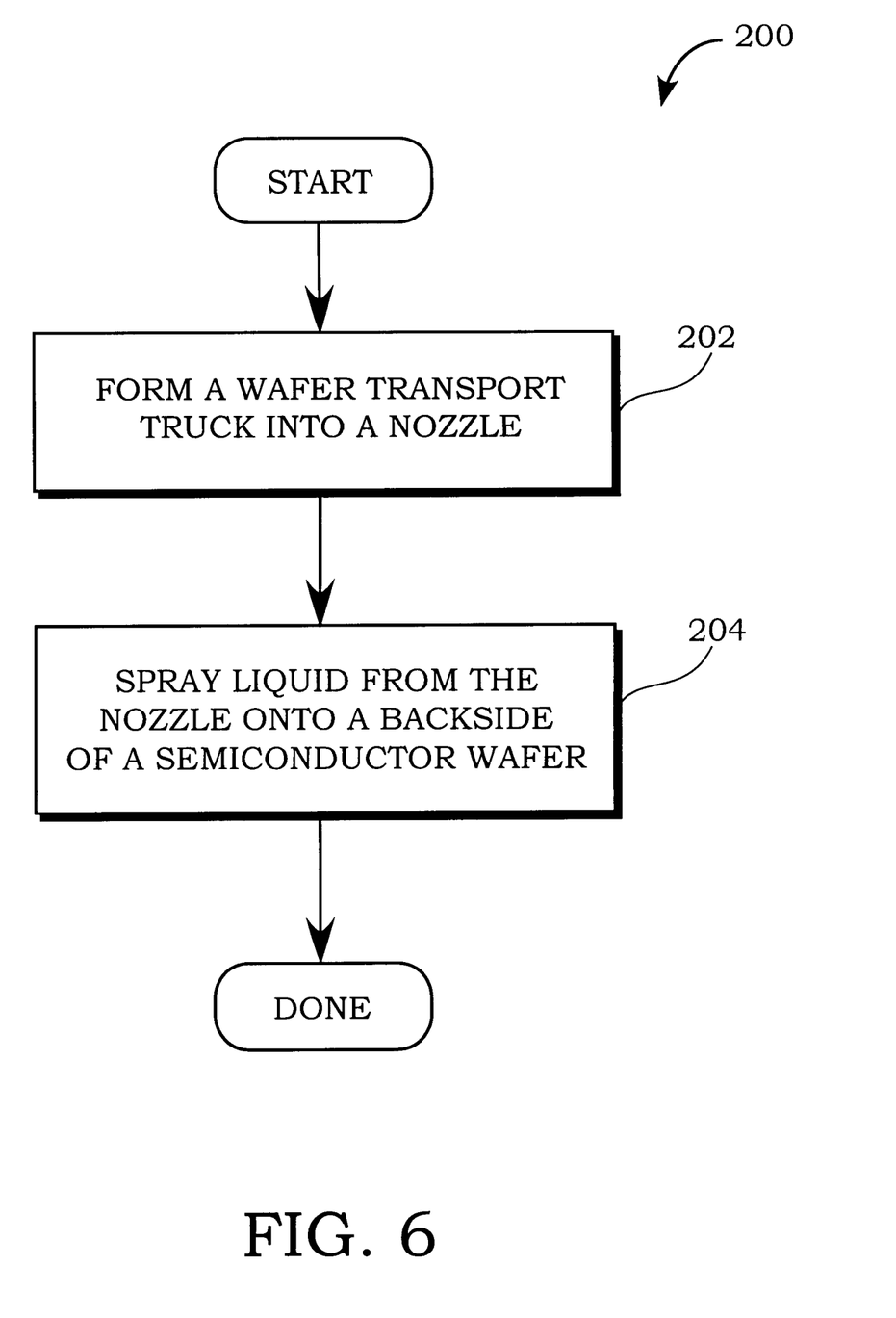
FIG. 6 shows a flowchart diagram illustrating the method operations performed in rinsing the backside of a semiconductor wafer in accordance with one embodiment of the present invention.

FIG. 6 shows a flowchart diagram 200 illustrating the method operations performed in rinsing a backside of a semiconductor wafer in accordance with one embodiment of the present invention. The method begins in operation 202 in which a wafer transport truck is formed into a nozzle. By way of example, the wafer transport truck may be formed into a nozzle, e.g., the nozzle shown in FIG. 4, using the method described above with reference to FIGS. 2A to 2G. Alternatively, the wafer transport truck may be formed into a one-piece version of the nozzle shown in FIG. 4 using a rapid prototyping technique, e.g., stereolithography, or an appropriate molding technique. Next, in operation 204, liquid, e.g., DI water, is sprayed from the nozzle onto a backside of a semiconductor wafer. In one embodiment, the nozzle is configured to direct a fanned spray toward a center portion of the backside of the wafer. In one embodiment, the nozzle includes a curved surface in which a slit is defined. Once liquid is sprayed onto the backside of the wafer, the method is done.

In one embodiment, the nozzle is disposed in a brush station just before an exit from a first brush box. In this manner, the backside of the wafer can be thoroughly and effectively rinsed as the wafer is transported from the first brush box to a second brush box. In another embodiment, the nozzle is disposed in a brush station just before an exit from a second brush box. In this manner, the backside of the wafer can be thoroughly and effectively rinsed as the wafer is transported from the second brush box to an SRD module.

As described herein, the nozzle of the present invention enables the backside of a semiconductor wafer to be thoroughly rinsed. This is beneficial because it not only minimizes particle contamination on the backside of the wafer, but also neutralizes the pH of the surface of the backside of the wafer.

In summary, the present invention provides a nozzle and a method for rinsing a backside of a semiconductor wafer. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A nozzle, comprising:
   a body having a horizontal extension and a vertical extension, the vertical extension having an entrance location and the horizontal extension having an exit location, the horizontal extension having a curved exit surface defined at the exit location and having a plurality of apertures defined therein;
   an internal chamber defined in the body below the curved exit surface;
   a channel extending between the entrance location and the internal chamber; and
   a slit defining an opening in the curved exit surface, the slit extending from the curved exit surface into the internal chamber, the curved exit surface and the slit being configured to define a fanned spray when liquid flows out of the slit.

2. The nozzle of claim 1, wherein the opening in the curved exit surface defines an elliptical path.

3. The nozzle of claim 1, wherein the slit is oriented at an angle of about 15 degrees to about 50 degrees relative to a horizontal plane.

4. The nozzle of claim 1, wherein the slit is oriented at an angle of about 30 degrees to about 35 degrees relative to a horizontal plane.

5. The nozzle of claim 1, wherein the body is formed in two pieces.

6. A nozzle, comprising:
- a body having a horizontal extension and a vertical extension, the vertical extension having an entrance location and the horizontal extension having an exit location, the horizontal extension having a curved exit surface defined at the exit location and having a plurality of apertures defined therein;
- an internal chamber defined in the body below the curved exit surface;
- a channel extending between the entrance location and the internal chamber; and
- a slit defining an opening in the curved exit surface, the slit extending from the curved exit surface into the internal chamber and being oriented at an angle between about 15 degrees and about 50 degrees relative to a horizontal plane, the opening in the curved exit surface defining an elliptical path, and the curved exit surface and the slit being configured to define a fanned spray when liquid flows out of the slit.

7. The nozzle of claim 6, wherein the slit is oriented at an angle of about 30 degrees to about 35 degrees relative to the horizontal plane.

8. The nozzle of claim 6, wherein the body is formed in two pieces.

9. A brush station for processing a semiconductor wafer, the brush station comprising:
- a first brush box having an inlet and an outlet;
- a second brush box having an inlet and an outlet, the inlet of the second brush box being positioned to receive a semiconductor wafer from the outlet of the first brush box; and
- a nozzle disposed in one of the first brush box and the second brush box, the nozzle being configured to spray a liquid onto the backside of a semiconductor wafer, wherein the nozzle comprises:
  - a body having a horizontal extension and a vertical extension, the vertical extension having an entrance location and the horizontal extension having an exit location, the horizontal extension having a curved exit surface defined at the exit location and having a plurality of apertures defined therein;
  - an internal chamber defined in the body below the curved exit surface;
  - a channel extending between the entrance location and the internal chamber; and
  - a slit defining an opening in the curved exit surface, the slit extending from the curved exit surface into the internal chamber, the curved exit surface and the slit being configured to define a fanned spray when liquid flows out of the slit.

10. The brush station of claim 9, wherein the nozzle is disposed in the first brush box in a position just before the outlet from the first brush box.

11. The brush box of claim 9, wherein the nozzle is disposed in the second brush box in a position just before the outlet from the second brush box.

12. The brush box of claim 9, wherein the fanned spray is directed toward a center portion of a backside of the semiconductor wafer.

* * * * *